(12) United States Patent
Amemiya et al.

(10) Patent No.: US 7,303,690 B2
(45) Date of Patent: Dec. 4, 2007

(54) MICROLENS FORMING METHOD

(75) Inventors: Hiroki Amemiya, Nirasaki (JP); Akihiro Kikuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 127 days.

(21) Appl. No.: 11/214,785

(22) Filed: Aug. 31, 2005

(65) Prior Publication Data

US 2006/0043068 A1   Mar. 2, 2006

Related U.S. Application Data

(60) Provisional application No. 60/614,041, filed on Sep. 30, 2004.

(30) Foreign Application Priority Data

Aug. 31, 2004  (JP) ............................. 2004-252205

(51) Int. Cl.
  H01L 21/302   (2006.01)
  B44C 1/22    (2006.01)
  C03C 15/00   (2006.01)
  C03C 25/68   (2006.01)
  C23F 1/00    (2006.01)
(52) U.S. Cl. ........................................ 216/63; 438/725
(58) Field of Classification Search ................ 216/63; 438/725
  See application file for complete search history.

(56) References Cited

U.S. PATENT DOCUMENTS

2001/0005637 A1 * 6/2001 Kim et al. ................. 438/710

2004/0197898 A1 * 10/2004 Nakatani et al. ......... 435/287.1
2005/0061772 A1   3/2005 Amemiya

FOREIGN PATENT DOCUMENTS

JP    10-148704    6/1998
JP    2000-164837  6/2000
JP    2002-110952  4/2002

OTHER PUBLICATIONS

Anonymous (Fabrication of a plano-convex microlens . . . ; Derwent 2000-180595).*
Mersereau et al. (Fabrication of fused silica microlens arrays; AT&T Bell Labs; Pro. SPIE, vol. 1751, p. 229-233, Jan. 1993).  .*

(Continued)

Primary Examiner—Nadine Norton
Assistant Examiner—Patricia A. George
(74) Attorney, Agent, or Firm—Oblon, Spivak, McClelland, Maier & Neustadt, P.C.

(57) ABSTRACT

In a method for forming microlenses, an etching process is performed by using a processing gas on an object to be processed provided with a substrate, a lens material layer formed on the substrate and a mask layer of a lens shape formed on the lens material layer to etch the lens material layer and the mask layer, so that the lens shape of the mask layer is transcribed to the lens material layer. The processing gas is a gaseous mixture of a gas containing fluorine atoms but no carbon atoms and a fluorocarbon-based gas having a ratio of the number of carbon atoms to the number of fluorine atoms which is greater than or equal to 0.5, the gaseous mixture having no oxygen gas.

12 Claims, 13 Drawing Sheets

OTHER PUBLICATIONS

Chen et al. (Fabricating a Silicon Microlens Mold by ICP dry etching; Apr. 2003 IEEE) ☐☐.*
Chen et al. (znO/PMMA Thin Film Nanocompositions of Optical Coatings; ; Rensselaer Nanotechnology Center, RPI; SPIE 2003).*
Wolf et al (Silicon Processing for the VLSI Era; vol. 1; 1986; Lattice Press).*
VisionDirect.com (advertisement for Ridgid Gas Permeable Lens, printed Mar. 2007).*

* cited by examiner

FLOW RATE OF $C_4F_6$ GAS [sccm]

FLOW RATE OF $C_4F_6$ GAS [sccm]

FIG.14
(PRIOR ART)

| PARAMETER  CHARAC-TERISTIC | PRESSURE IN PROCESSING CHAMBER 10mT→20→60 LOW → HIGH | HIGH FREQUENCY POWER 300W→600→900 LOW → HIGH | MOUNTING TABLE TEMPERATURE 0°C → 40 LOW → HIGH | FLOW RATE RATIO (CF$_4$/CHF$_3$) 60/0 → 40/20 LOW → HIGH | FLOW RATE OF CF$_4$ 60sccm → 120 LOW → HIGH | FLOW RATE RATIO (CF$_4$/CO) 60/0 → 60/60 → 30/90 LOW → HIGH |
|---|---|---|---|---|---|---|
| ETCHING RATE HIGH ← LOW | ↗ | ↙ | ↑ | ↗ | ↖ | ↑ |
| DISTANCE BETWEEN LENSES (A) WIDE ← NARROW | ↖ | ↙ | ↑ | ↗ | ↙ | ↑ |

# MICROLENS FORMING METHOD

PRIORITY

This application claim priority of: Provisional Application No. 60/614,041 filed Sep. 30, 2004; and foreign application JP 2004-252205 filed Aug. 31, 2004.

FIELD OF THE INVENTION

The present invention relates to a method for forming microlenses used for, e.g., a solid-state imaging device.

BACKGROUND OF THE INVENTION

A microlens has been used as an on-chip lens for solid-state imaging device such as a CCD (charge coupled device) or CMD (charge modulation device), or LCD (liquid crystal display) devices. In general, such microlens is formed by a following method. For example, as shown in FIG. 13A, a mask layer 20 composed of a resist film configured in a predetermined lens shape, is formed on a lens material layer 10 formed of an organic film composed of, e.g., an i-line photo-permeable resin. Further, by etching the mask layer 20 and the lens material layer 10, the lens shape of the mask layer 20 is transcribed to the lens material layer 10. Thus, a microlens 12 shown in FIG. 13B is formed.

In the solid-state imaging device employing the microlens, due to a miniaturization thereof, the pixel area becomes getting smaller, so that the amount of the incident light onto each pixel is getting smaller, deteriorating the sensitivity thereof. To this end, it is required to increase the area of the lens such that a larger amount of light is to be converged at the focal point. For the purpose, it is desirable to have a lens shape achieving a maximum lens area in each microlens, for example, a lens shape wherein a lens width of each microlens is increased while a distance A between adjacent lenses (see FIG. 13B) becomes decreased.

Accordingly, up to now, a microlens has been formed of a shape such that the distance A between adjacent lenses is as narrower as possible, by etching the mask layer 20 and the lens material layer 10 by using, e.g., $CF_4$ gas as the processing gas (see, e.g., Japanese Patent Laid-open Publication Nos. H10-148704 and 2002-110952).

However, it takes very long time to employ the conventional method, which uses $CF_4$ gas as the processing gas, to perform the etching process due to the low etching rate thereof. For this reason, there is a limitation in increasing the productivity of microlenses. Furthermore, since a longer etching time is required if the lens area in the microlens is increased and the distance A between adjacent lenses is decreased, it is impossible to enlarge the lens area while reducing the etching time in the conventional method.

Even in such conventional method, if the etching rate is the only concern, it is possible to enhance the etching rate by changing the parameters such as the flow rate of $CF_4$ gas and the like during the etching process. However, if the parameters are changed during the etching process such that the etching rate is increased, the characteristics of the lens shape become degraded such that the resultant lens area of the microlens becomes small and the distance A between adjacent lenses increases.

Hereinafter, there will be described the results of the experiments wherein the parameters are changed during the etching process with reference to FIG. 14. FIG. 14 shows trends of changes in the etching rate and the distance between adjacent lenses when various parameters are changed during the etching process. The parameters related to the etching rate include a pressure in the processing chamber, a high frequency power applied to the electrode, a temperature of the mounting table, a flow rate of $CF_4$ gas, and a flow rate ratio of $CF_4$ gas to other gases ($CHF_3$, CO, etc.) added thereto. In FIG. 14, as for the etching rate, for example, in case the arrow points to the acclivity, the etching rate tends to increase. Also, as for the distance A between lenses, for example, in case the arrow points to the acclivity, the lens width tends to decrease and the distance A between lenses tends to increase.

As can be seen from FIG. 14, when either the high frequency power or the flow rate of $CF_4$ gas is increased, the etching rate tends to increase and the distance A between lenses also tends to increase. This is because, in case of using $CF_4$ gas as the processing gas, it is hard to appropriately control to have a balance between F acting as an etching species of the mask layer 20 and the lens material layer 10 and C and the like acting as a deposit species, among the dissociation products generated while $CF_4$ is plasmarized to be dissociated, even though the etching is performed by changing the parameters such as the flow rate of the processing gas and the pressure in the processing chamber.

As such, in the conventional method using $CF_4$ gas as the processing gas, since there is a tradeoff between the etching rate and the lens area, it is impossible to increase the etching rate while enlarging the lens area at the same time.

Furthermore, there has been disclosed in Japanese Patent Laid-open Publication No. 2000-164837 a method for forming microlenses by using $SF_6$ gas instead of $CF_4$ gas as a processing gas. However, the processing gas in the above-described method contains $O_2$ as well and the resultant lens area becomes small due to the small lens width. The reason for this is considered that the lens shape in the resist layer itself becomes smaller due to the fact that oxygen O facilitates the etching on the resist film, which is an organic film, among the dissociated products generated while the processing gas is plasmarized to be dissociated, resulting in a smaller lens shape in the lens material layer transcribed from the lens shape in the resist film. In the disclosures of Japanese Patent Laid-open Publication Nos. H10-148704 and 2002-110952, the processing gas also contains $O_2$ gas, and therefore the resultant lens area becomes rather small as in Japanese Patent Laid-open Publication No. 2000-164837.

SUMMARY OF THE INVENTION

It is, therefore, an object of the present invention to provide a microlens forming method capable of forming microlenses having a larger lens area at a higher etching rate compared with those by the conventional methods.

In accordance with one aspect of the present invention, there is provided a method for forming microlenses, including: performing an etching process by using a processing gas on an object to be processed provided with a substrate, a lens material layer formed on the substrate and a mask layer of a lens shape formed on the lens material layer to etch the lens material layer and the mask layer; and transcribing the lens shape of the mask layer to the lens material layer, wherein the processing gas is a gaseous mixture of a gas containing fluorine atoms but no carbon atoms and a fluorocarbon-based gas having a ratio of the number of carbon atoms to the number of fluorine atoms which is greater than or equal to 0.5, the gaseous mixture having no oxygen gas. The gas containing fluorine atoms but no carbon atoms is either $SF_6$ gas or $NF_3$ gas. Preferably, the ratio of the number of carbon atoms to the number of fluorine atoms in the fluorocarbon-based gas is smaller than 0.7. In this case, the fluorocarbon-based gas is at least one selected from a group consisting of $C_4F_8$, $C_5F_8$ and $C_4F_6$ gas. Further, the lens material layer is a photo-permeable organic film and the mask layer is a resist film.

In the microlens forming method of the present invention, since a gaseous mixture of the gas containing fluorine atoms but no carbon atoms, e.g., $SF_6$ gas and a fluorocarbon-based gas having a ratio of the number of carbon atoms to the number of fluorine atoms which is greater than or equal to 0.5, e.g., $C_4F_8$ gas, is used as a processing gas, the etching process is performed in an atmosphere that has more fluorine radicals acting as an etching species compared with a case of a conventional method using $CF_4$ gas as a processing gas, and at the same time C and the like acting as a deposit species are deposited appropriately on around the peripheral edge of the mask layer. Therefore, an etching rate greater than that in the prior art can be obtained, and at the same time, a lower portion of the lens shape gets broader as the etching process progresses, thereby enlarging the lens area.

As such, in case of using the processing gas of the present invention, by appropriately controlling the balance between F acting as an etching species and C acting as an deposit species by controlling the flow rate or its ratio of the processing gas, an etching rate greater than that in the prior art can be obtained and the characteristics of the resultant microlenses can be enhanced.

Also, since the processing gas contain no oxygen gas, it is possible to prevent both the lens shape of the resist film itself and the lens shape transcribed to the lens material layer from becoming small.

Further, the processing gas may contain at least one selected from a group consisting of a fluorocarbon-based gas, a hydrofluorocarbon-based gas, $N_2$ gas and an inert gas. By adding the above gas(es) to the processing gas and controlling the flow rate or flow rate ratio thereof, it is possible to precisely control the balance between the etching species and the deposit species.

In accordance with another aspect of the present invention, there is provided a method for forming microlenses, including: performing an etching process by using a processing gas on an object to be processed provided with a substrate, a lens material layer formed on the substrate and a mask layer of a lens shape formed on the lens material layer to etch the lens material layer and the mask layer; and transcribing the lens shape of the mask layer to the lens material layer, wherein the processing gas is a gaseous mixture of $SF_6$ gas with at least one selected from a group consisting of $C_4F_8$, $C_5F_8$ and $C_4F_6$ gas. Further, the processing gas contains no oxygen gas in order to prevent the lens shape from becoming small due to the action of oxygen radicals. In addition, the mask layer may be a resist film.

Furthermore, in case the processing gas is a gaseous mixture of $SF_6$ and $C_4F_8$ gas, a volumetric ratio between the $SF_6$ gas and the $C_4F_8$ gas ($SF_6$ gas:$C_4F_8$ gas) is preferably in the range of 1:1~1:4. In case the processing gas is a gaseous mixture of $SF_6$ and $C_5F_8$ gas, a volumetric ratio between the $SF_6$ gas and the $C_5F_8$ gas ($SF_6$ gas:$C_5F_8$ gas) is preferably in the range of 1:0.4~1:0.8. In case the processing gas is a gaseous mixture of $SF_6$ and $C_4F_6$ gas, the volumetric ratio between the $SF_6$ gas and the $C_4F_6$ gas ($SF_6$ gas:$C_4F_6$ gas) is preferably in the range of 1:0.3~1:0.8.

By setting the volumetric ratio of $SF_6$ gas and $C_4F_8$ gas or the like included in the processing gas of the present invention to the above ratios, it is possible to form microlenses with a larger lens area than that in the prior art at a higer etching rate than that in the prior art.

Meanwhile, in the specification, 1 mTorr is $(10^{-3} \times 101325/760)$ Pa, and 1 sccm is $(10^{-6}/60)$ $m^3$/sec In accordance with the microlens forming method of the present invention, the etching rate can be increased and the characteristics of the lens shape can be enhanced. Accordingly, the productivity of the microlenses can be increased compared with that of the prior art, and it is possible to form microlenses having a large lens area with the distance between lenses extremely short.

BRIEF DESCRIPTION OF THE DRAWINGS

The above and other objects and features of the present invention will become apparent from the following description of preferred embodiments given in conjunction with the accompanying drawings, in which:

FIGS. 13A and 13B are drawings for explanation of a conventional microlens forming method wherein FIGS. 13A and 13B are schematic cross sectional views showing film structures before and after the etching process, respectively; and FIG. 14 shows trends of the changes in etching rate and distance between lenses in case when various parameters are changed during the etching process wherein $CF_4$ gas is used as the processing gas.

DETAILED DESCRIPTION OF THE PREFERRED EMBODIMENTS

Figure 1:
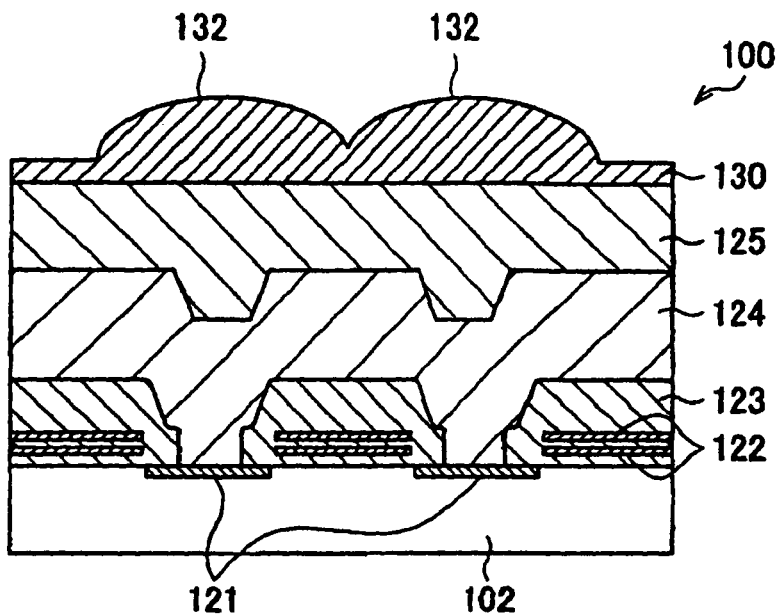
FIG. 1 depicts a cross sectional view showing an exemplary constitution of a solid-state imaging device having a microlens formed by a microlens forming method in accordance with a preferred embodiment of the present invention.

Hereinafter, there will be described preferred embodiments in accordance with the present invention with reference to the accompanying drawings. Also, in the specification and the drawings, like parts having substantially same functions are represented by like reference numerals, and redundant explanation thereon will be omitted.

(Exemplary Constitution of a Solid-State Imaging Device)

First of all, there will be described the exemplary constitution of the solid-state imaging device having a microlens formed by a microlens forming method in accordance with a preferred embodiment of the present invention with reference to FIG. 1. The solid-state imaging device 100 has a semiconductor substrate 102 having at its surface photosensitive parts 121 arranged in a matrix pattern. The incident light upon the photosensitive parts 121 is photoelectically converted by a photodiode.

In the area other than the areas of the photosensitive parts 121 disposed on the semiconductor substrate 102, there is provided a conductive film 122 forming the transfer electrode including, e.g., poly-silicon. A shading film 123 made of, e.g., aluminum is formed on the conductive film 122. The shading film 123 is to prevent light from being illuminated onto the conductive film 122 while allowing the light to be incident upon the photosensitive parts 121. For this reason, openings for incident light are provided in the area of the shading film 123 corresponding to the photosensitive parts. On the shading film 123, there is formed a planarization film 124 including, e.g., polyimide or polystyrene resin.

A color filter layer 125 is formed on the planarization film 124. There are formed in the area corresponding to the photosensitive parts 121 on the color filter layer 125 microlenses 132 including an organic film formed of, e.g., an i-line photo-permeable resin. The microlenses 132 are to focus the light into the photosensitive parts 121. In order to focus more light, the microlens 132 is formed such that the plane size thereof is larger than the photosensitive part 121. Such microlenses 132 may be arranged, e.g., by rotating the grid array by 45°.

(Method of Forming Microlenses)

Figure 2:
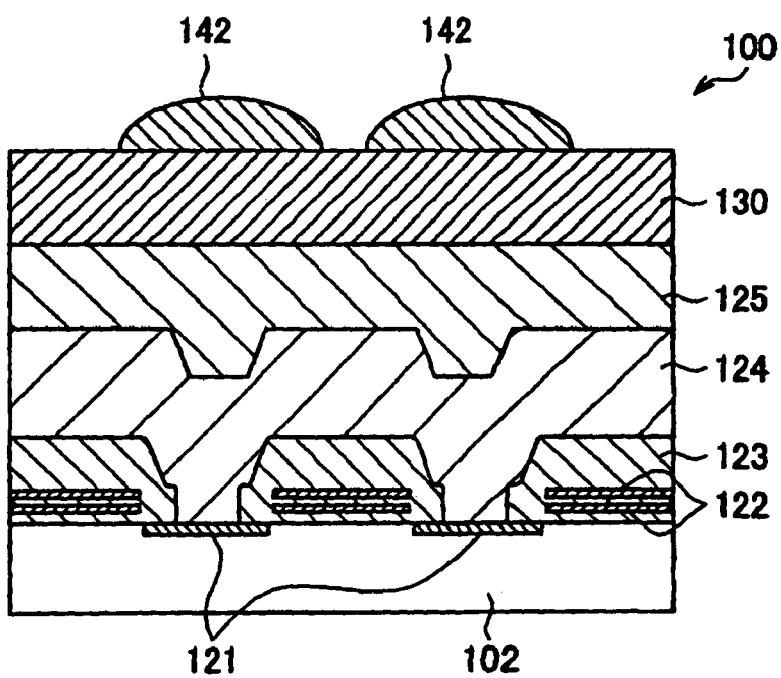
FIG. 2 represents an exemplary constitution of a film structure for forming the macrolens as shown in FIG. 1 through an etching process.

Next, there will be described the microlens forming method in accordance with the preferred embodiment of the present invention with reference to the drawings. FIG. 2 is an exemplary constitution of a film structure on which an etching process is performed to form the microlenses. FIG. 3 shows the procedures of forming the microlenses by the etching process.

The film structure in FIG. 2 is formed as follows. First, the photosensitive parts 121 are formed on the semiconductor substrate 102 of the solid-state imaging device 100, and the conductive film 122 and the shading film 123 are then formed. And, the planarization film 124 and the color filter layer 125 are formed in this order. Further, a lens material layer 130 is formed to have a thickness of, e.g., 1 µm on the color filter layer 125 by, e.g., a chemical vapor deposition ("CVD") method. The lens material layer 130 includes a photo-permeable organic film. In particular, the photo-permeable organic film includes organic films containing photo-permeable resins used as a resist such as i-line, g-line, acryl, COMA, a compound of acryl and COMA, and $F_2$. As the lens material forming the lens material layer 130, an inorganic film such as $Si_3N_4$ film and a compound of organic and inorganic film as well as the above-described organic film may be used.

Further, on the lens material layer 130, a mask layer 142 including, e.g., KrF resist or i-line resist is formed of a predetermined lens shape. In the process of forming the mask layer 142 in the predetermined lens shape, the mask layer 142 is first formed, patterned by photolithography, and then heat-treated to the lens shape.

An etching process in accordance with the preferred embodiment is performed on the film structure thus formed as shown in FIG. 2. That is to say, by etching the mask layer 142 and the lens material layer 130 at the same time, the lens shape of the mask layer 142 is transcribed onto the lens material layer 130. In this way, through the procedures shown in FIGS. 3A to 3D, microlenses 132 of the predetermined shape as shown in FIG. 1 are formed.

In the etching process in accordance with this preferred embodiment, as a processing gas (etching gas), a gaseous mixture of a gas containing fluorine atoms but no carbon atoms and a fluorocarbon-based gas is used. The gas containing fluorine atoms but no carbon atoms includes $SF_6$ or $NF_3$. The fluorocarbon-based gas preferably has a ratio of the number of carbon atoms to the number of fluorine atoms that is greater than or equal to 0.5, and more preferably a ratio of the number of carbon atoms to the number of fluorine atoms that is less than 0.7. Addition of the fluorocarbon-based gas to the processing gas makes it easy to control to have the balance between F radicals acting as etching species for the mask layer 142 and the lens material layer 130 and C, CF radical and the like acting as deposit species as will be described later. Such type fluorocarbon-based gas includes $C_4F_8$, $C_5F_8$ and $C_4F_6$ gas. The fluorocarbon-based gas may be used as one type or by mixing two or more types.

In the etching process using such processing gas, F among the dissociation products dissociated from a processing gas, in which $SF_6$ gas and $C_4F_8$ gas are mixed for example, acts as an etching species for the mask layer 142 and the lens material layer 130 while C, CF, CF $CF_2$ and $CF_3$ radicals act as a deposit species. Accordingly, the etching with F and the deposit of C and the like are performed at the same time during the etching process.

In this case, by using as the processing gas a gas containing fluorine atoms but no carbon atoms and a fluorocarbon-based gas having a ratio of the number of carbon atoms to the number of fluorine atoms which is greater than or equal to 0.5, the etching is performed in an atmosphere where fluorine radicals are much more abundant compared with a case of employing a conventional method using $CF_4$ gas as a processing gas. Therefore, it is possible to obtain an etching rate greater than the conventional one.

Figure 3A:
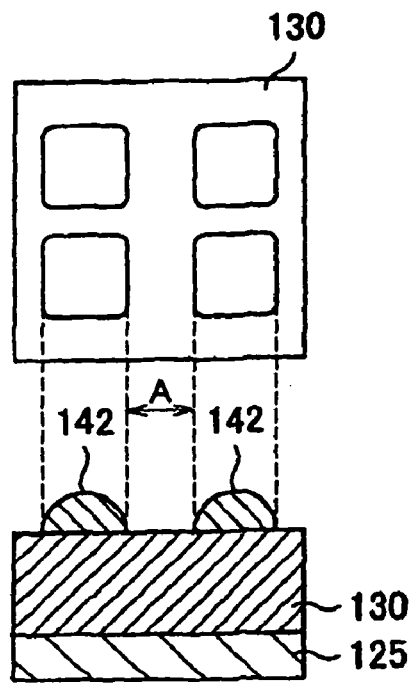
FIGS. 3A, 3B, 3C and 3D set forth a procedure for forming the microlens through the etching process in accordance with the preferred embodiment of the present invention.
Figure 3B:
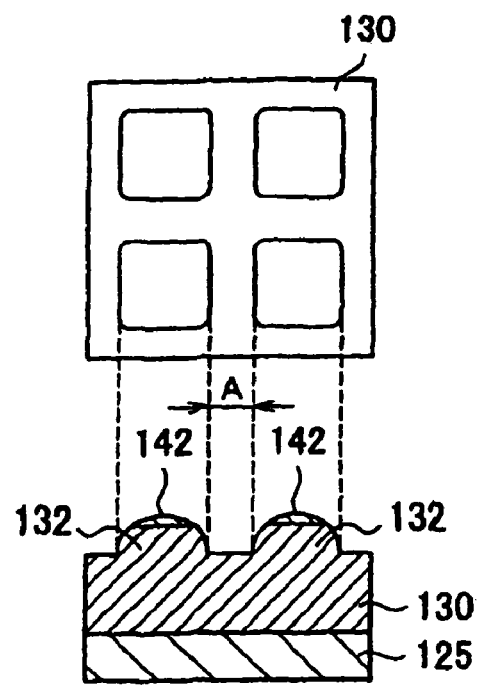
Figure 3C:
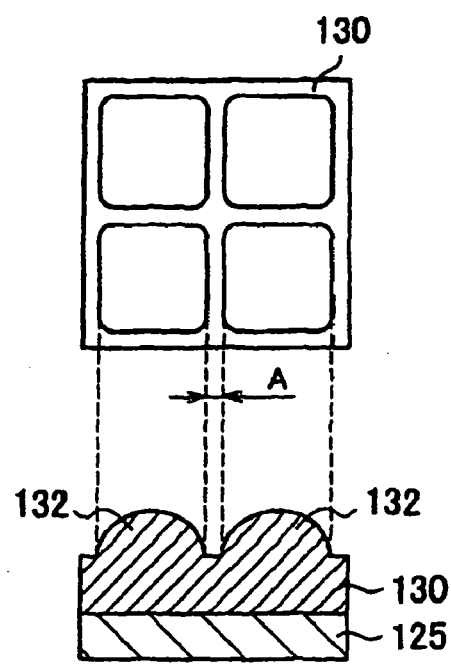
Figure 3D:
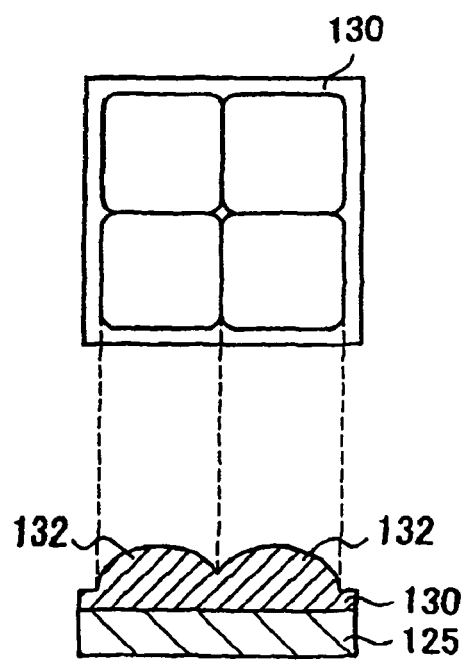

Further, C and the like acting as a deposit species are deposited on the area around the peripheral edge of the lens shape in the mask layer 142. Therefore, as the etching process is performed as shown in FIGS. 3A to 3C, the lower part of the lens shape gets broader and the lens area gets larger. In this way, the mask layer 142 is transcribed to the lens material layer 130 so that microlenses 132 having at the central portion thereof a curvature same as that of the lens shape of the mask layer 142 as shown in FIG. 3D and a larger lens area than that of the mask layer 142 at an higher etching rate than that in the prior art.

Moreover, a fluorocarbon-based gas such as $CF_4$, $C_2F_6$ and $C_3F_8$, a hydrofluorocarbon-based gas, CO gas, $CO_2$ gas, $N_2$ gas, and inert gas may be added to the processing gas. By adding these gases to the processing gas and controlling the flow rate and its ratio thereof, the balance control between the etching species and the deposit species can be carried out more precisely.

Furthermore, the processing gas in accordance with the present invention preferably contains no oxygen gas ($O_2$ gas). This is to avoid shortcomings that, if the processing gas contains $O_2$ gas, the oxygen radical O generated as a dissociation product after the processing gas is plasmarized accelerates the etching of the resist film which is an organic film to thereby make the lens shape of the resist film itself smaller and also the lens shape transcribed to the lens material layer smaller.

(Exemplary Constitution of the Etching Apparatus)

Next, there will be described an exemplary constitution of the etching apparatus for performing the etching process to form the microlenses with reference to the drawings. The etching process of the present invention may be performed in a variety of etching apparatuses such as a parallel plate type plasma etching apparatus, a helicon wave plasma etching apparatus, and an inductively coupled plasma etching apparatus.

Figure 4:
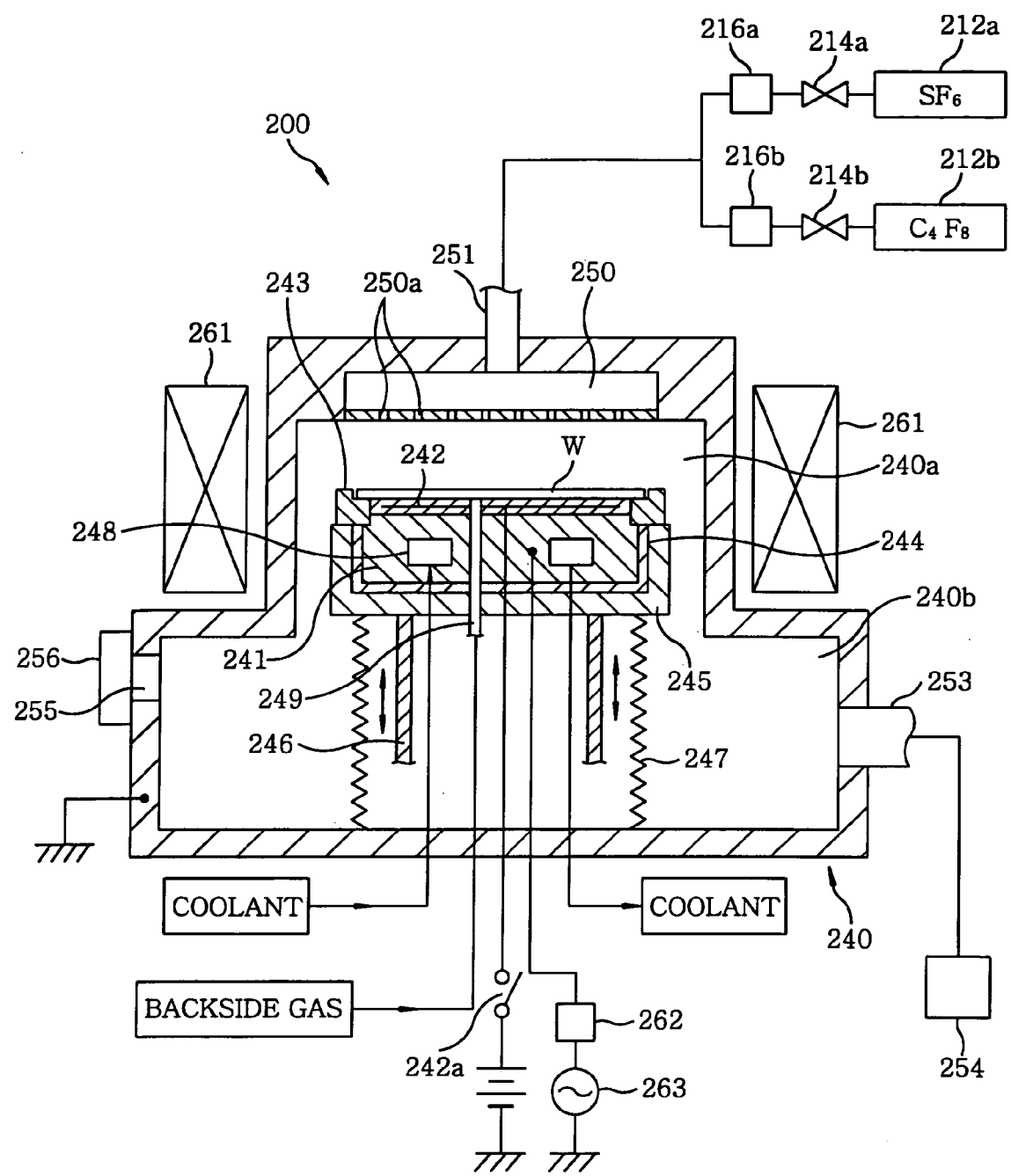
FIG. 4 describes a schematic cross sectional view showing an exemplary constitution of an etching apparatus performing the etching process in accordance with the present invention.

Here, a magnetron RIE plasma etching apparatus is described as an example. FIG. 4 is a schematic cross sectional view showing concrete constitution of the etching apparatus 200 in accordance with the preferred embodiment of the present invention, and the etching apparatus 200 has a cylindrical processing chamber 240 whose wall is made of, e.g., aluminum. The processing chamber 240 is air-tightly formed and electrically grounded. The processing chamber 240 includes an upper room 240a and a lower room 240b having a larger diameter than that of the upper room 240a.

In the processing chamber 240, there is provided a mounting table 241 for horizontally sustaining an object to be processed, e.g., a semiconductor wafer (hereinafter, referred to as "wafer" for simplicity). The mounting table 241 also acts as a lower electrode and is made of, e.g., aluminum. On the surface of the mounting table 241, there is provided an electrostatic chuck 242 for adsorbing and holding the wafer W with the help of an electrostatic adsorption force. The electrostatic chuck 242 is connected to a power supply via a power switch 242a.

On the mounting table 241, a focus ring 243 is installed such that it surrounds the wafer W which is electrostatically adsorbed on the electrostatic chuck 242. The mounting table 241 is supported via an insulating plate 244 by a sustainer 245 made of a conductive material. The mounting table 241 may be fixed to the processing chamber 240 or may be constructed to move up and down through the sustainer 245. For example, an elevating unit including ball screws 246 may be attached to the sustainer 245, so that the mounting table 241 is movable by the elevating unit between a mounting position where the surface thereof is located at the lower room 240b and the processing position shown in FIG. 4.

A bellows 247 formed of stainless steel (SUS) is disposed between the lower room 240b and the mounting table 241. The sustainer 245 is connected to the processing chamber 240 through the bellows 247.

Inside the mounting table 241, there is formed a coolant path 248 through which a coolant flows such that the surface temperature of the mounting table 241 can be controlled to be kept at, e.g., 40~60° C., and the temperature of the wafer W can be controlled to be maintained at a predetermined level, e.g., about 100° C., by the temperature of this mounting table 241 and the incident heat from the plasma.

Further, in the mounting table 241, there is formed a gas channel for supplying a backside gas as cooling gas between the electrostatic chuck 242 and the backside of the wafer W. In this way, the wafer W can be cooled down efficiently even when the processing chamber 240 is maintained in a vacuum state as will be described later.

In the area of the ceiling wall of the processing chamber 240 facing the mounting table 241, there is formed a gas supply room 250 which is electrically grounded and serves as an upper electrode. The gas supply room 250 has a plurality of gas discharge holes 250a at the lower part thereof. A processing gas (etching gas) source is connected through a gas feed line 251 to the upper part of the gas supply room 250.

The processing gas source varies depending on the kind of the processing gas used for the etching process. For example, in case of using a gaseous mixture of $SF_6$ gas and $C_4F_8$ gas as the processing gas, as shown in FIG. 4, $SF_6$ gas source 212a and $C_4F_8$ gas source 212b are connected to the gas feed line 251 via valves 214a, 214b and mass flow controllers 216a, 216b, respectively. With such arrangements, the processing gas, e.g. the $SF_6$ gas and the $C_4F_8$ gas, discharged through the gas discharge holes 250a of the gas supply room 250 toward the mounting table 241 is uniformly supplied to the entire surface of the mounting table 241.

Around the upper room 240a of the processing chamber 240, there are disposed dipole magnets 261 provided with multiple anisotropic segments of pillar shaped magnets. The mounting table 241 is connected to the high frequency power supply 263 for plasma generation through a matching unit 262, and a high frequency power in the range of 100~2000 W of a predetermined frequency, e.g. 13.56 MHz is applied to the mounting table 241 serving as the lower electrode. Thus, the gas supply room 250 and the mounting table 241 function as a pair of electrodes. This processing chamber 240 is evacuated to a predetermined vacuum level by a vacuum exhaust unit 254 through a gas exhaust line 253.

Further, a loading/unloading port 255 for the wafer W is formed in the sidewall of the processing chamber 240. In the loading/unloading port 255, there is provided a gate valve 256 for opening and closing it.

(Operation of the Etching Apparatus)

Next, there will be described the operation of the etching apparatus 200 that performs the etching process. Here, there will be described an example where the etching process in accordance with the preferred embodiment of the present invention is performed on the film structure shown in FIG. 2 in order to form the microlenses 132 as shown in FIG. 1.

First, a wafer W having the film structure shown in FIG. 2, i.e., a wafer W having on its surface the solid-state imaging device equipped with the lens material layer 130 and the mask layer 142, is loaded into the processing chamber 240 through the gate valve 256 at the loading/unloading port 255 and is mounted on the mounting table 241 located at the mounting position. The mounting table 241 is then moved up to the processing position, and the processing chamber 240 is evacuated to a predetermined vacuum level by the vacuum exhaust unit 254. Next, a processing gas, e.g., a gaseous mixture of $SF_6$ and $C_4F_8$ gas, is introduced into the processing chamber 240 at a predetermined flow rate ratio (volumetric ratio).

Meanwhile, a predetermined high frequency power from the high frequency power supply 263 is applied to the mounting table 241, so that a high frequency electric field is generated between the gas supply room 250 and the mounting table 241 functioning as the upper and the lower electrode, respectively. Here, since a horizontal magnetic field is formed by the dipole magnets 261 in the upper room 240*a*, an orthogonal electromagnetic field is formed in the processing space in which the wafer W is present, and magnetron discharge occurs due to the drift of electrons created by the orthogonal electromagnetic field. And the processing gas is plasmarized by the magnetron discharge, and the lens material layer 130 and the mask layer 142 on the wafer W are etched simultaneously by the plasma.

With the etching process in accordance with the preferred embodiment of the present invention, it is possible to improve the characteristics of the lens shape, e.g., form microlenses of a larger lens area than that in the prior art while increasing the etching rate. Hereinafter, there will be described evaluations of the etching rate and the lens shape of the microlens by using specific experimental results.

(Evaluation of the Lens Shape of the Microlens)

Figure 5:
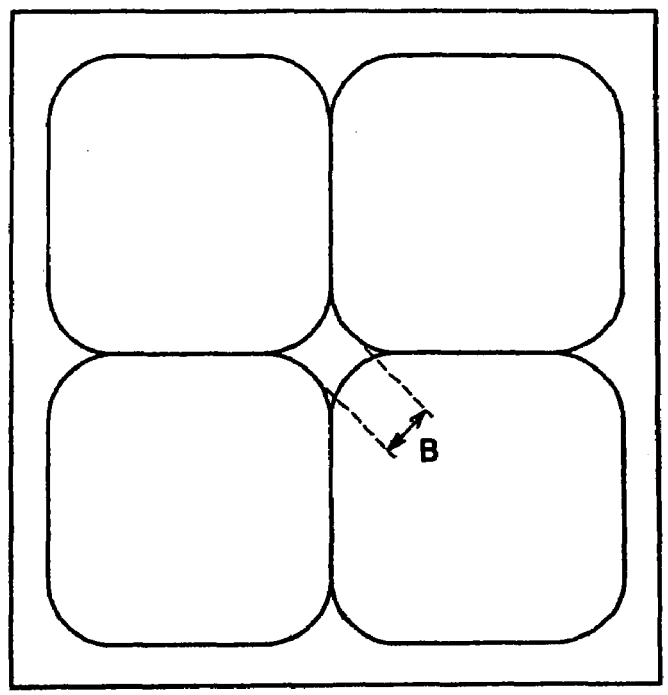
FIG. 5 presents an example of a lens shape of the microlens formed through the etching process of the preferred embodiment of the present invention.
Figure 6:
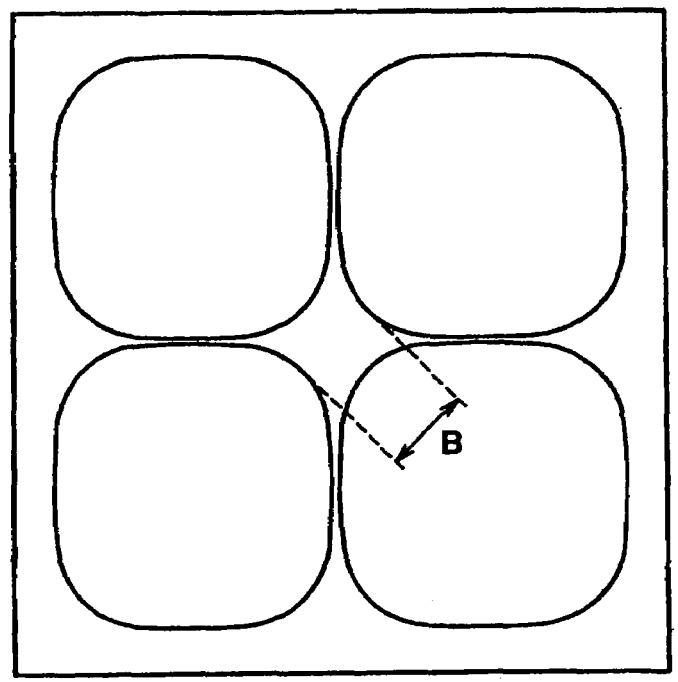
FIG. 6 shows an example of a lens shape of the microlens formed through the etching process wherein $CF_4$ gas is used as a processing gas.

First, there will be described an evaluation of the lens shape of the microlenses formed by the etching process in accordance with the preferred embodiment in comparison with the lens shape of the microlenses formed by an etching process using $CF_4$ as a processing gas. FIGS. 5 and 6 show an example of the lens shapes of the microlenses formed by the etching process in accordance with the preferred embodiment and an example of the lens shapes of the microlenses formed by the etching process using $CF_4$ as the processing gas. FIGS. 5 and 6 are images of the microlenses, formed by etching a same thickness of the film, photographed by a scanning electron microscope from above.

In case of FIG. 5, the microlenses were etched under etching conditions that the narrowest distance A between lenses was obtained when a gaseous mixture of $SF_6$ gas and $C_4F_8$ gas was used as the processing gas. For example, the etching process was performed under following etching conditions.

Flow rate ratio of the processing gas ($C_4F_8$ gas flow rate/$SF_6$ gas flow rate): 160 sccm/60 sccm Pressure in the processing chamber: 40 mT High frequency power applied to the mounting table: 1000 W Temperature of the mounting table: 0° C.

Magnetic field: 120 G.

In this case, the distance A between lenses of the microlenses was 0 nm.

On the other hand, in case of FIG. 6, the microlenses were etched under the etching conditions that the narrowest distance A between lenses was obtained when $CF_4$ gas was used as the processing gas.

As shown in FIG. 5, in accordance with the etching process of the present invention, the distance A between lenses of the microlenses can be made narrower than that in FIG. 6. Further, in accordance with the etching process of the present invention, when the distance A between lenses of the microlenses becomes 0 nm, the areas in the corners of the microlenses become larger as shown in FIG. 5, and therefore the lens area thereof becomes larger than that in FIG. 6. As described above, by the etching process in accordance with the preferred embodiment of the present invention, the distance B between the corners of the microlenses as well as the distance A between lenses can be reduced, thereby enhancing the characteristics of the lens shape and enlarging the lens area compared with the case of the prior art.

Furthermore, whereas the etching rate upon forming of the lens shape in FIG. 6 was 163.4 nm/min, the etching rate upon forming of the lens shape in FIG. 5 was 262.9 nm/min. That is to say, by the etching process in accordance with the preferred embodiment of the present invention, the microlenses with the lens shape shown in FIG. 5 can be formed at an etching rate 1.5 times higher than that in FIG. 6. As such, in accordance with the etching process of the present invention, microlenses having a larger lens area than that in the prior art can be formed at a higher etching rate than that in the prior art.

(Evaluation of Etching Rate)

Figure 7:
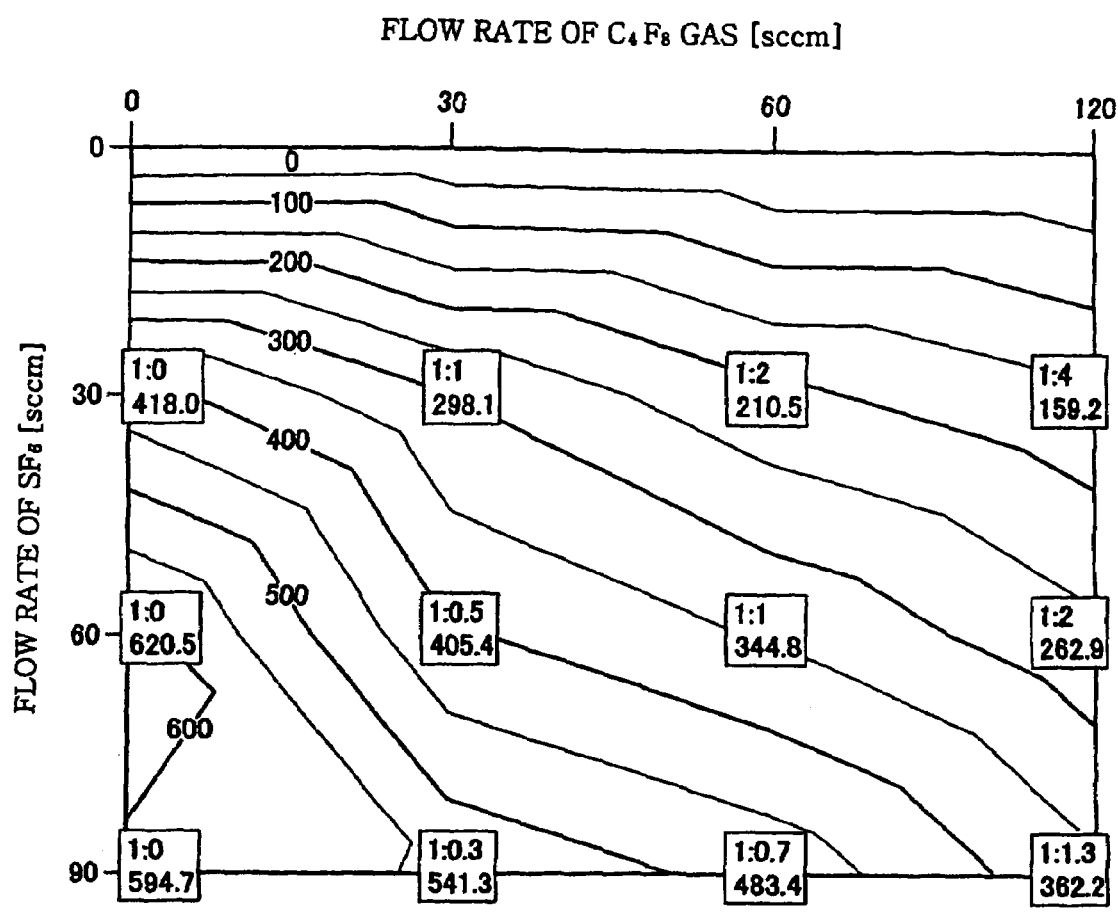
FIG. 7 demonstrates a relationship between a flow rate ratio (volumetric ratio) and an etching rate in case that the etching process in accordance with the preferred embodiment of the present invention is performed by using a gaseous mixture of $SF_6$ gas and $C_4F_8$ gas as the processing gas.
Figure 8:
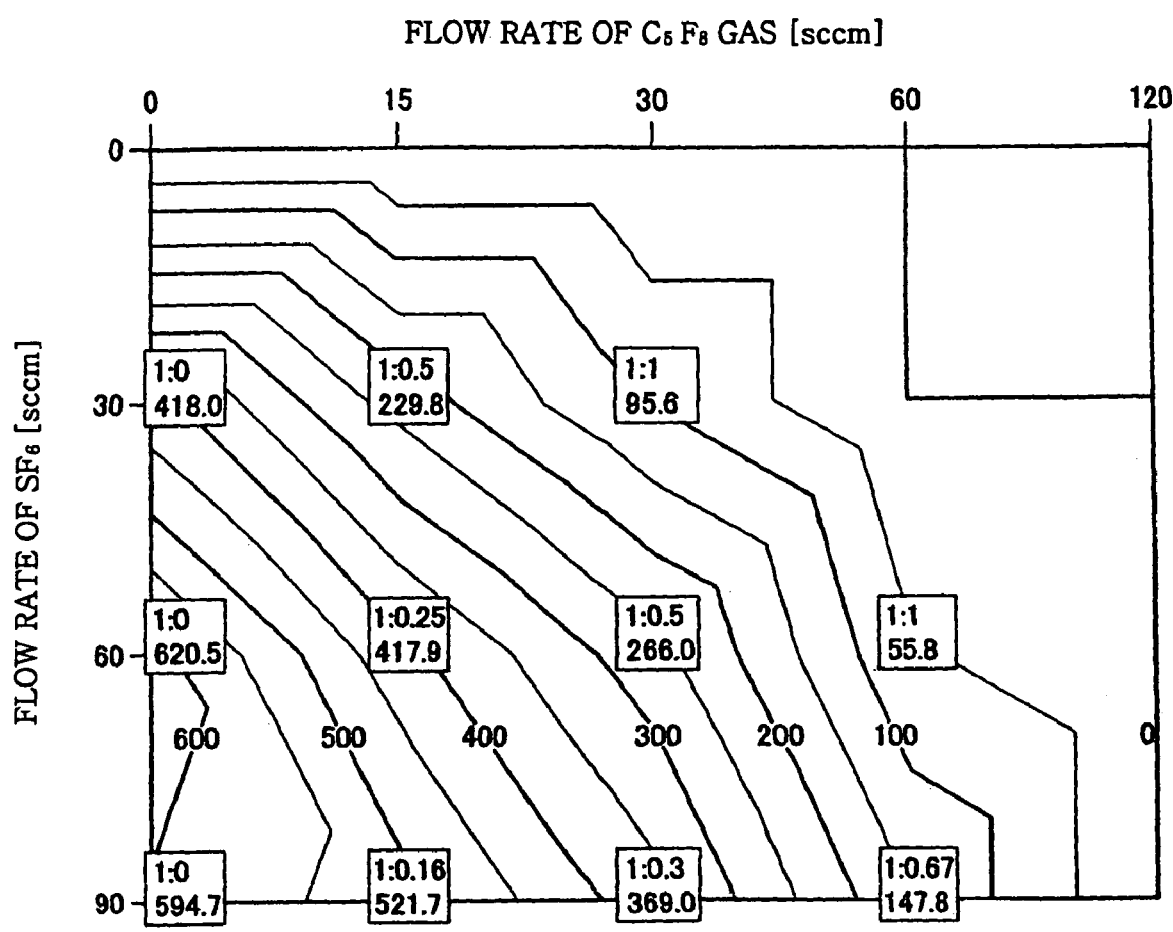
FIG. 8 depicts a relationship between a flow rate ratio (volumetric ratio) and an etching rate in case that the etching process in accordance with the preferred embodiment of the present invention is performed by using a gaseous mixture of $SF_6$ gas and $C_5F_8$ gas as the processing gas.
Figure 9:
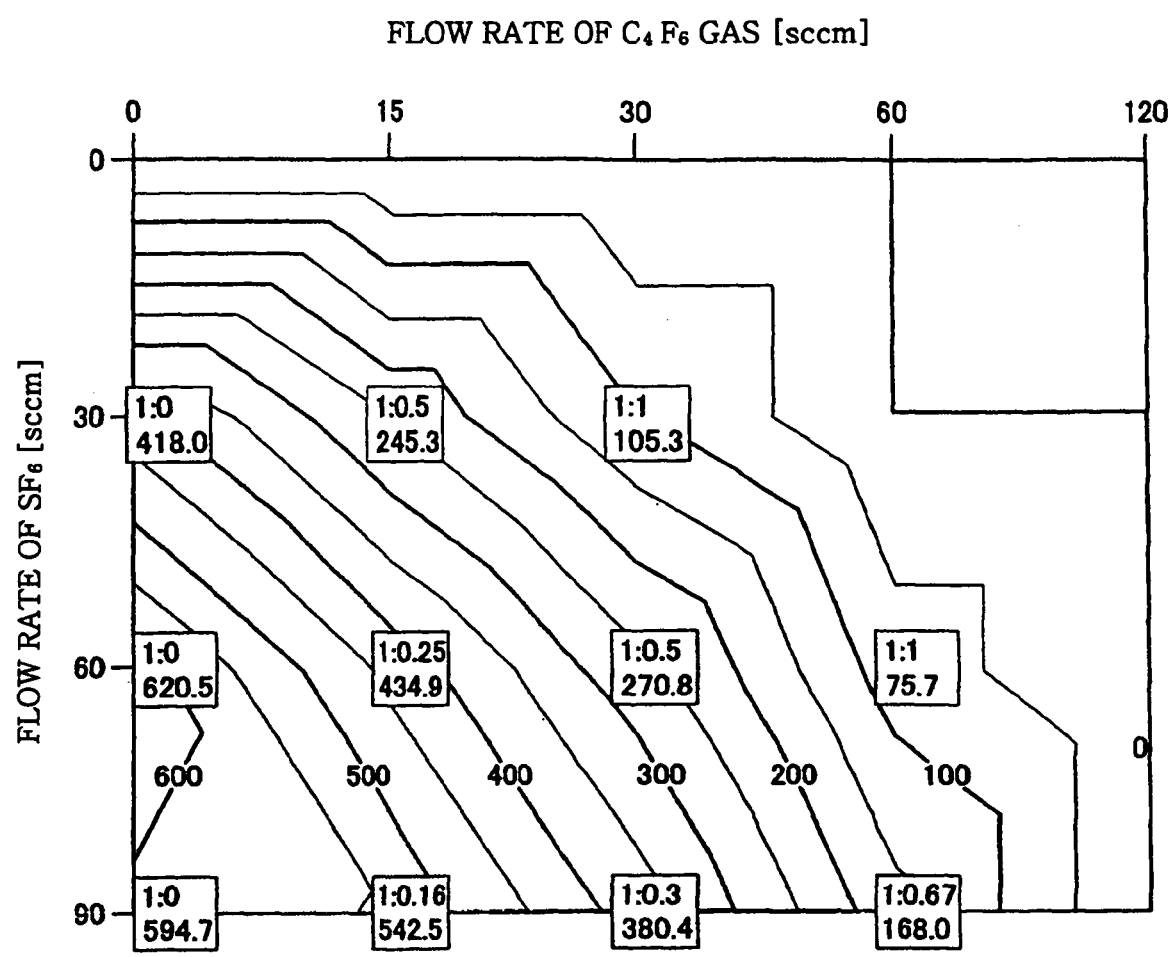
FIG. 9 describes a relationship between a flow rate ratio (volumetric ratio) and an etching rate in case that the etching process in accordance with the preferred embodiment of the present invention is performed by using a gaseous mixture of $SF_6$ gas and $C_4F_6$ gas as the processing gas.

Next, there will be described results showing the evaluation of the etching rate in the preferred embodiment with reference to FIGS. 7 to 12. FIGS. 7 to 9 are drawings showing the relationship between the flow rate ratio (volumetric ratio) and the etching rate in case of performing the etching process of the present invention by using as a processing gas a gaseous mixture of $SF_6$ gas and $C_4F_8$, $C_5F_8$ or $C_4F_6$ gas.

In FIGS. 7 to 9, the vertical axes represent respective flow rates of $SF_6$ gas and the horizontal axes indicate the respective flow rates of $C_4F_8$, $C_5F_8$ and $C_4F_6$ gas. The contour lines in FIGS. 7 to 9 show the respective etching rates at the flow rate ratios in the horizontal and vertical axes. Further, the horizontal axes in FIGS. 8 and 9 change scales at 0~30 sccm, 30~60 sccm, 60~120 sccm in order to easily demonstrate the ranges where the etching rate increases.

In addition, in FIGS. 7 to 9, measured values of the flow rate ratios and the etching rates at the main measurement points are indicated in boxes, respectively. For example, in the experimental result shown in FIG. 7, in case the flow rate of $C_4F_8$ gas was variously set to be 0 sccm, 30 sccm, 60 sccm and 120 sccm while setting the flow rate of $SF_6$ gas to 30 sccm, that is, in case the flow rate ratios between $SF_6$ gas and $C_4F_8$ gas (volumetric ratio of $SF_6$ gas:$C_4F_8$ gas) were 1:0, 1:1, 1:2 and 1:4, the etching rates were 418.0 nm/min, 298.1 nm/min, 210.5 nm/min and 159.2 nm/min, respecrively.

Also, in case the flow rate of $C_4F_8$ gas was variously set to 0 sccm, 30 sccm, 60 sccm and 120 sccm while setting the flow rate of $SF_6$ gas to 60 sccm, that is, in case the flow rate ratios between $SF_6$ gas and $C_4F_8$ gas (volumetric ratio of $SF_6$ gas:$C_4F_8$ gas) were 1:0, 1:0.5, 1:1 and 1:2, the etching rates were 620.5 nm/min, 405.4 nm/min, 344.8 nm/min and 262.9 nm/min, respectively.

Further, in case the flow rate of $C_4F_8$ gas was varied to be set to 0 sccm, 30 sccm, 60 sccm and 120 sccm while setting the flow rate of $SF_6$ gas to 90 sccm, that is, in case the flow rate ratios between $SF_6$ gas and $C_4F_8$ gas (volumetric ratio of $SF_6$ gas:$C_4F_8$ gas) were 1:0, 1:0.3, 1:0.7 and 1:1.3, the etching rates were 594.7 nm/min, 541.3 nm/min, 483.4 nm/min and 362.2 nm/min, respectively.

In the experimental result shown in FIG. 8, in case the flow rate of $C_5F_8$ gas was variously set to be 0 sccm, 15 sccm and 30 sccm while setting the flow rate of $SF_6$ gas to 30 sccm, that is, in case the flow rate ratios between $SF_6$ gas and $C_5F_8$ gas (volumetric ratio of $SF_6$ gas:$C_5F_8$ gas) were 1:0, 1:0.5 and 1:1, the etching rates were 418.0 nm/min, 229.8 nm/min and 95.6 nm/min, respectively.

Also, in case the flow rate of $C_5F_8$ gas was varied to be set to 0 sccm, 15 sccm, 30 sccm and 60 sccm while setting the flow rate of $SF_6$ gas to 60 sccm, that is, in case the flow rate ratios between $SF_6$ gas and $C_5F_8$ gas (volumetric ratio of $SF_6$ gas:$C_5F_8$ gas) were 1:0, 1:0.25, 1:0.5 and 1:1, the etching rates were 620.5 nm/min, 417.9 nm/min, 266.0 nm/min and 55.8 nm/min, respectively.

Further, in case the flow rate of $C_5F_8$ gas was variously set to be 0 sccm, 15 sccm, 30 sccm and 60 sccm while setting the flow rate of $SF_6$ gas to 90 sccm, that is, in case the flow rate ratios between $SF_6$ gas and $C_5F_8$ gas (volumetric ratio of $SF_6$ gas:$C_5F_8$ gas) were 1:0, 1:0.16, 1:0.3 and 1:0.67, the etching rates were 594.7 nm/min, 521.7 nm/min, 369.0 nm/min, and 147.8 nm/min, respectively.

In the experimental result shown in FIG. 9, in case the flow rate of $C_4F_6$ gas was variously set to be 0 sccm, 15 sccm and 30 sccm while setting the flow rate of $SF_6$ gas to 30 sccm, that is, in case the flow rate ratios between $SF_6$ gas and $C_4F_6$ gas (volumetric ratio of $SF_6$ gas:$C_4F_6$ gas) were 1:0, 1:0.5 and 1:1, the etching rates were 418.0 nm/min, 245.3 nm/min and 105.3 nm/min, respectively.

Also, in case the flow rate of $C_4F_6$ gas was variously set to be 0 sccm, 15 sccm, 30 sccm and 60 sccm while setting the flow rate of $SF_6$ gas to 60 sccm, that is, in case the flow rate ratios between $SF_6$ gas and $C_4F_6$ gas (volumetric ratio of $SF_6$ gas:$C_4F_6$ gas) were 1:0, 1:0.25, 1:0.5 and 1:1, the etching rates were 620.5 nm/min, 434.9 nm/min, 270.8 nm/min and 75.7 nm/min, respectively.

Further, in case the flow rate of $C_4F_6$ gas was variously set to be 0 sccm, 15 sccm, 30 sccm and 60 sccm while setting the flow rate of $SF_6$ gas to 90 sccm, that is, in case the flow rate ratios between $SF_6$ gas and $C_4F_6$ gas (volumetric ratio of $SF_6$ gas:$C_4F_6$ gas) were 1:0, 1:0.16, 1:0.3 and 1:0.67, the etching rates were 594.7 nm/min, 542.5 nm/min, 380.4 nm/min and 168.0 nm/min, respectively.

Moreover, as for the etching conditions other than the processing gas under which the experimental results shown in FIGS. 7 to 9 were obtained, the pressure in the processing chamber was 40 mT, the high frequency power supply applied to the mounting table was 1000 W, the temperature of the mounting table was 0° C., and the magnetic field was 120 G.

As shown in FIGS. 7 to 9, in case of using as the processing gas a gaseous mixture of $SF_6$ gas with $C_4F_8$, $C_5F_8$ or $C_4F_6$ gas, it has been found that there are regions where the etching rate becomes higher than that in the prior art. In particular, in case using $CF_4$ gas as the processing gas, in the etching process capable of forming the microlenses having the lens shape with the narrowest distance A between lenses (for example, the lens shape as shown in FIG. 6), the etching rate is 163.4 nm/min. On the other hand, depending on the flow rate ratio between $SF_6$ gas that is the etching species and $C_4F_8$, $C_5F_8$ or $C_4F_6$ gas that is the deposit species, there are regions where the etching rate becomes greater than the above 163.4 nm/min. Furthermore, as can be seen from FIGS. 7 to 9, the etching rate tends to increase as the flow rate of $SF_6$ gas acting as the etching species increases and to decrease as the flow rate of $C_4F_8$ gas and the like acting as the deposit species increases.

According to the experimental results shown in FIGS. 7 to 9, the practical ranges of the flow rate ratio of the processing gas where the etching rates become higher than that in the prior are as follows. That is to say, in case of using a gaseous mixture of $SF_6$ gas and $C_4F_8$ gas as the processing gas, the practical range of the flow rate ratio between the $SF_6$ gas and the $C_4F_8$ gas (volumetric ratio of $SF_6$ gas:$C_4F_8$ gas) is approximately 1:0~1:4 as shown in FIG. 7. In case of using a gaseous mixture of $SF_6$ gas and $C_5F_8$ gas as the processing gas, the practical range of the flow rate ratio between the $SF_6$ gas and the $C_5F_8$ gas (volumetric ratio of $SF_6$ gas:$C_5F_8$ gas) is approximately 1:0~1:0.8 as shown in FIG. 8. In case of using a gaseous mixture of $SF_6$ gas and $C_4F_6$ gas as the processing gas, the practical range of the flow rate ratio between the $SF_6$ gas and the $C_4F_6$ gas (volumetric ratio of $SF_6$ gas:$C_4F_6$ gas) is approximately 1:0~1:0.8 as shown in FIG. 9.

According to the experimental results shown in FIGS. 7 to 9, it has been confirmed that, in the etching process of the present invention, an etching rate higher than that in the prior art can be obtained by setting the flow rate ratio between $SF_6$ gas primarily serving as the etching species and $C_4F_8$ gas primarily serving as the deposit species in the practical ranges.

Figure 10A:
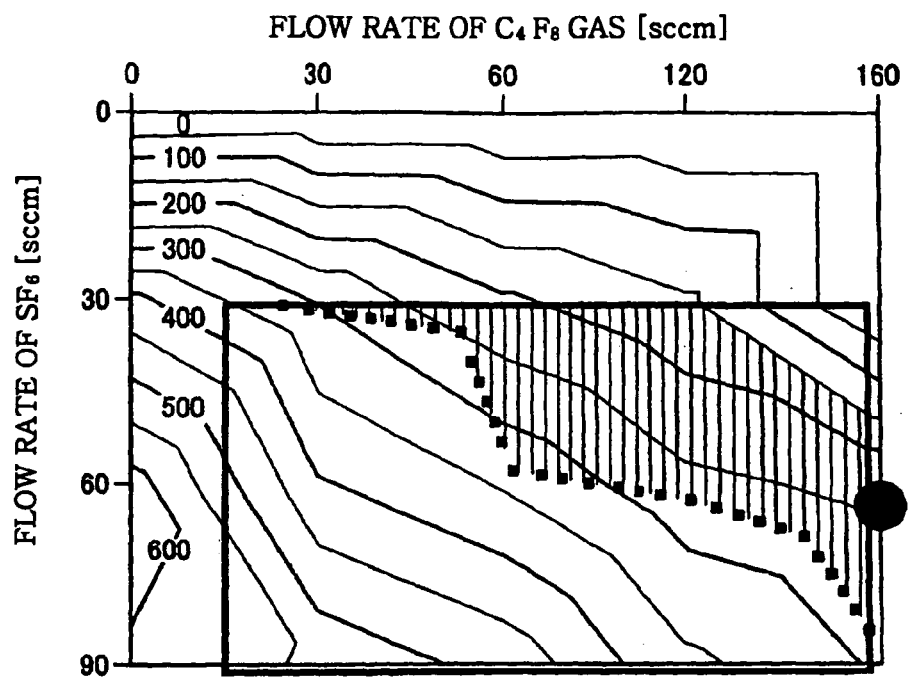
FIGS. 10A and 10B show a range of the flow rate ratio of the processing gas wherein the narrowest distance A between lenses of the microlenses can be obtained from the experimental result shown in FIG. 7.
Figure 10B:
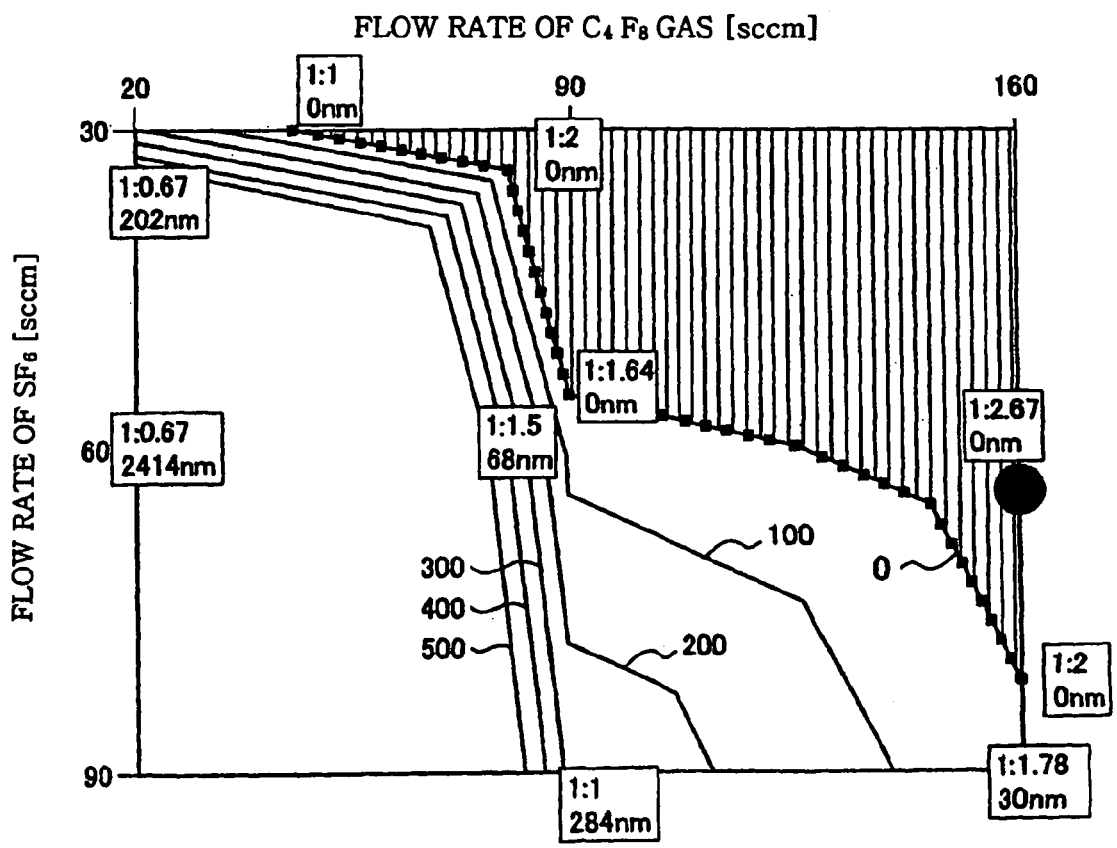
Figure 11A:
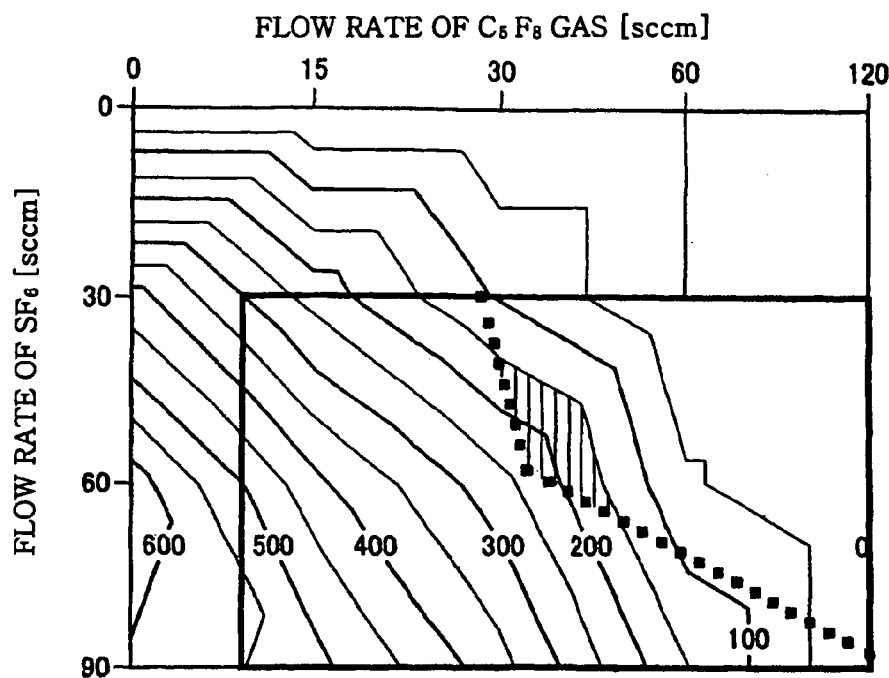
FIGS. 11A and 11B represent a range of the flow rate ratio of the processing gas wherein the narrowest distance A between lenses of the microlenses can be obtained from the experimental result shown in FIG. 8.
Figure 11B:
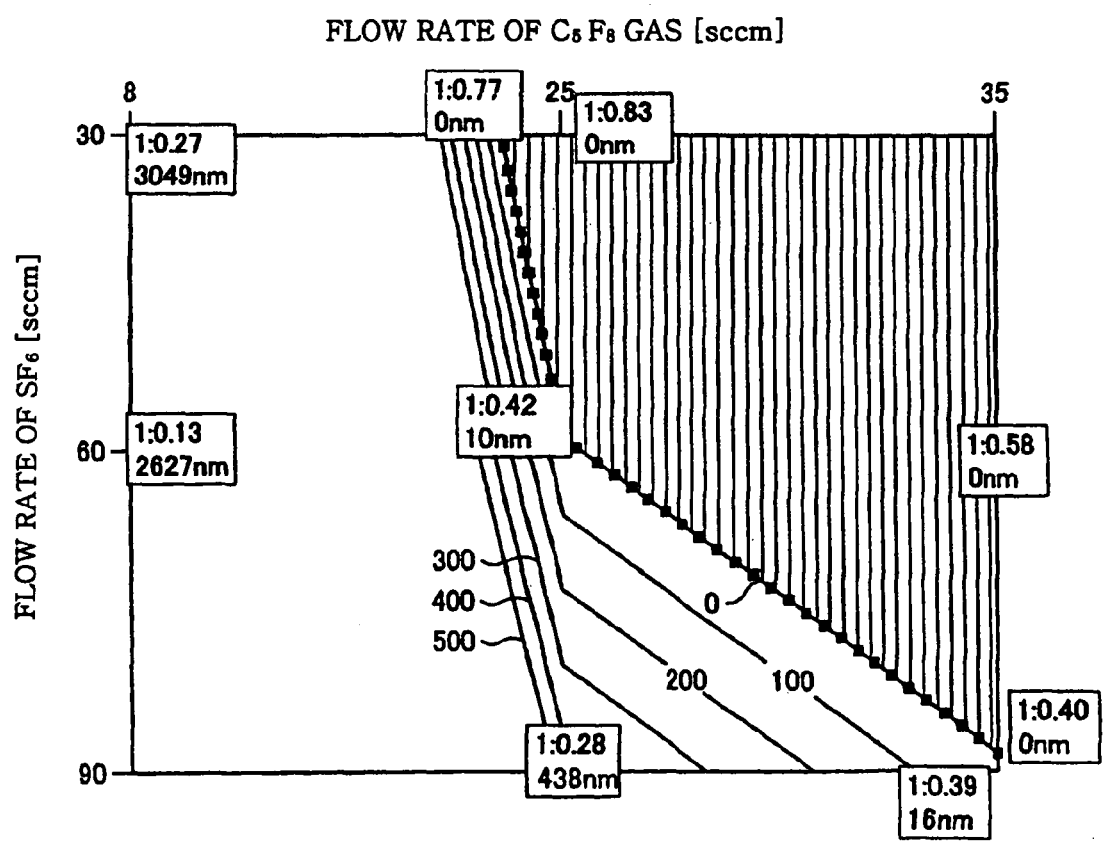
Figure 12A:
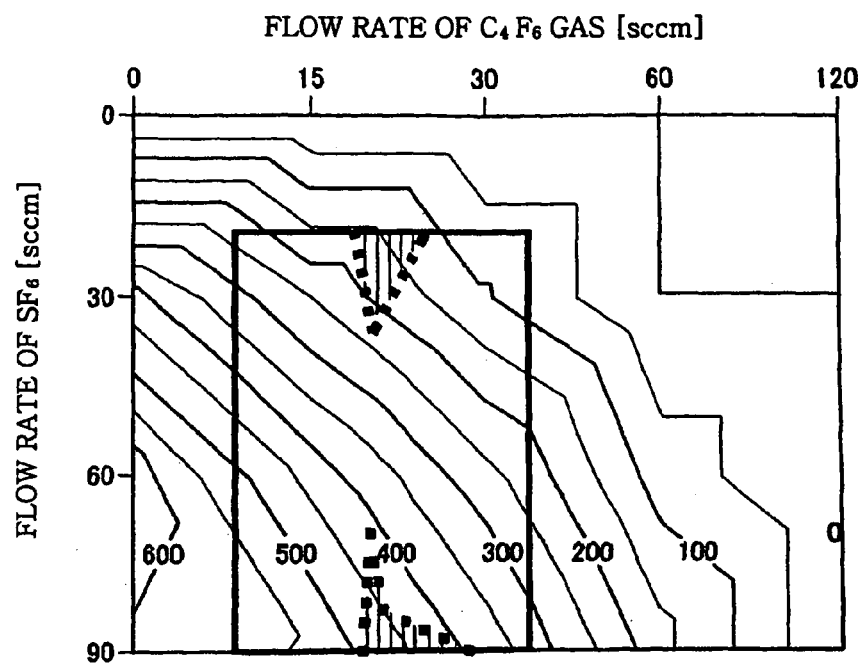
FIGS. 12A and 12B set forth a range of the flow rate ratio of the processing gas wherein the narrowest distance A between lenses of the microlenses can be obtained from the experimental result in FIG. 9.
Figure 12B:
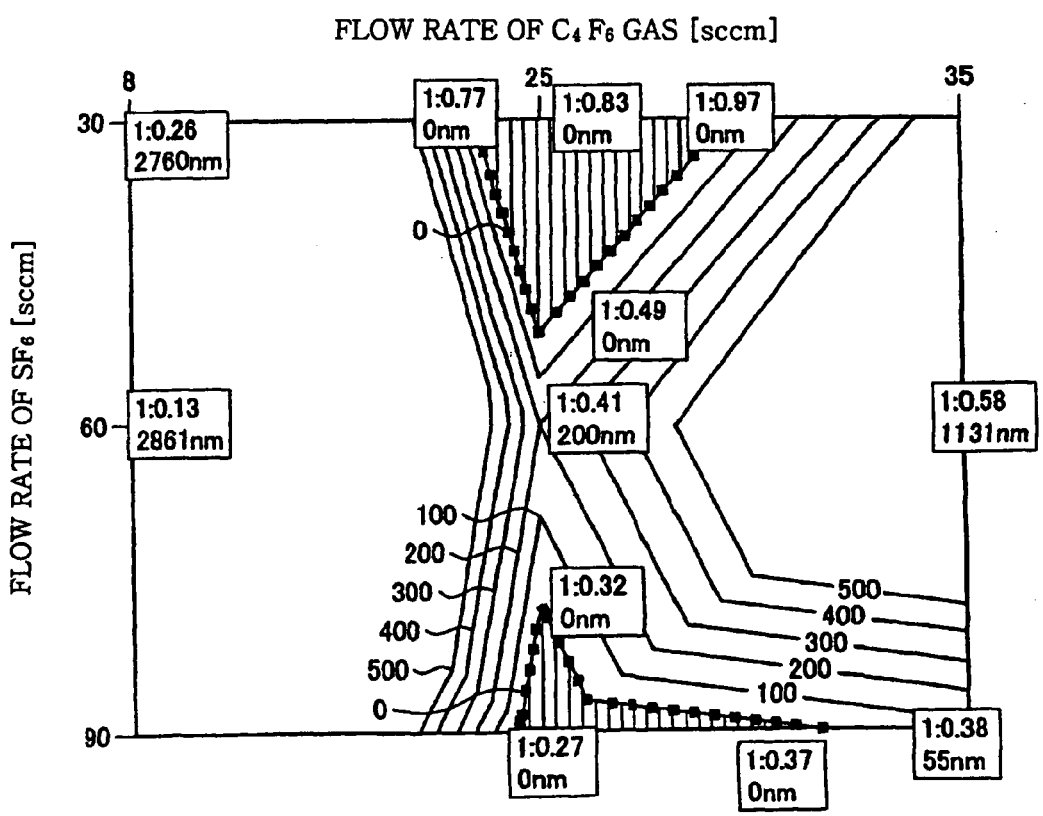
Figure 13A:
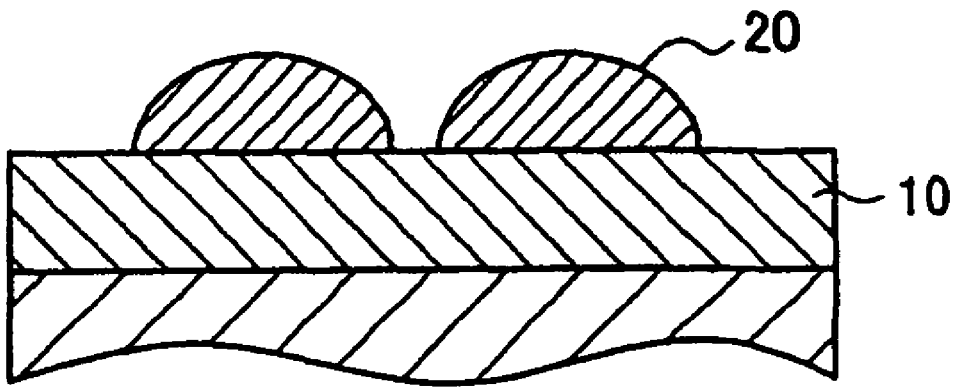
Figure 13B:
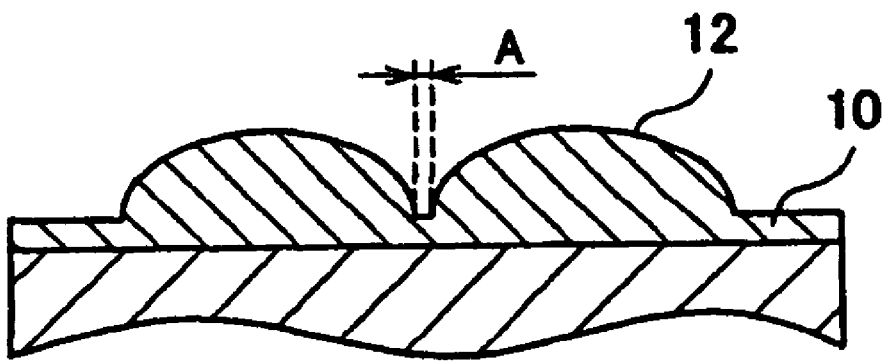

Next, in the experimental results shown in FIGS. 7 to 9, the ranges of flow rate ratios of the processing gas wherein the narrowest distance A between lenses of the microlenses can be obtained are shown in FIGS. 10A to 12B. In FIGS. 10A, 11A and 12A, the ranges where the distance. A between lenses of the microlenses becomes 0 nm in FIGS. 7 to 9 are indicated by hatching. In FIGS. 10B, 11B and 12B, part or all of the areas surrounded by the thick frame in FIGS. 10A, 11A and 12A are indicated enlarged, respectively. In FIGS. 10B, 11B and 12B, the contour lines of the etching rate are omitted and there are shown other contour lines indicating the distance A between lenses. Also, in FIGS. 10B, 11B and 12B, the measured values of the flow rate ratio and the distance A between lenses at main measurement points are indicated in boxes, respectively.

It can be seen from FIGS. 10B, 11B and 12B that there are ranges where the distance A between lenses becomes 0 nm (hatched areas) when some amount of $C_4F_8$ gas or the like are added to $SF_6$ gas.

Specifically, the ranges of the flow rate ratios of the processing gas where the distance A between lenses becomes narrowest, i.e., 0 nm, are as follows. That is to say, in case of using a gaseous mixture of $SF_6$ gas and $C_4F_8$ gas as the processing gas, the range is where the flow rate ratio between $SF_6$ gas:$C_4F_8$ gas (volumetric ratio of $SF_6$ gas:$C_4F_8$ gas) is approximately 1:$N_1$ ($N_1$ is 1 or larger), as shown in FIG. 10B.

Also, in case of using a gaseous mixture of $SF_6$ gas and $C_5F_8$ gas as the processing gas, the range is where the flow rate ratio between $SF_6$ gas:$C_5F_8$ gas (volumetric ratio of $SF_6$ gas:$C_5F_8$ gas) is approximately 1:$N_2$ ($N_2$ is 0.4 or larger), as shown in FIG. 11B.

Further, in case of using a gaseous mixture of $SF_6$ gas and $C_4F_6$ gas as the processing gas, the range is where the flow rate ratio between $SF_6$ gas:$C_4F_6$ gas (volumetric ratio of $SF_6$ gas:$C_4F_6$ gas) is approximately 1:$N_3$ ($N_3$ is 0.27 or larger), as shown in FIG. 12B.

(Practical Range of Flow Rate Ratio of Processing Gas)

By considering the flow rate ratios of the processing gas with respect to both the etching rate in FIGS. 7 to 9 and the lens shape in FIGS. 10A to 12B, the practical ranges of the flow rate ratio wherein the etching rate can be increased compared with that in the prior art and also the characteristics of the lens shape can be enhanced are as follows. That is to say, in case of using a gaseous mixture of $SF_6$ gas and $C_4F_8$ gas as the processing gas, the practical range of the flow rate ratio between $SF_6$ gas:$C_4F_8$ gas (volumetric ratio of $SF_6$ gas:$C_4F_8$ gas) is approximately 1:1~1:4, from FIGS. 7, 10A and 10B.

Also, in case of using a gaseous mixture of $SF_6$ gas and $C_5F_8$ gas as the processing gas, the practical range of the flow rate ratio between $SF_6$ gas:$C_5F_8$ gas (volumetric ratio of $SF_6$ gas:$C_5F_8$ gas) is approximately 1:0.4~1:0.8, from FIGS. 8, 11A and 11B.

Further, in case of using a gaseous mixture of $SF_6$ gas and $C_4F_6$ gas as the processing gas, the practical range of the flow rate ratio between $SF_6$ gas:$C_4F_6$ gas (volumetric ratio of $SF_6$ gas:$C_4F_6$ gas) is approximately 1:0.3~1:0.8, from FIGS. 9, 12A and 12B.

By setting the flow rate ratio of the processing gas in the above practical ranges, not only the distance A lenses of the microlenses but also the distance B between the corners of the lenses can be decreased, and the lens area can be accordingly enlarged by an amount corresponding to the decreased amount of the distances. For example, microlenses formed by an etching process employing the flow rate ratio of the processing gas at the point indicated with the black circle in FIG. 10 have a lens shape as shown in FIG. 5 and the lens area thereof is enlarged compared with that in FIG. 6 of the prior art.

As described above, in the etching process in accordance with the preferred embodiment of the present invention, by setting flow rate ratio of $SF_6$ gas to $C_4F_8$ gas or the like in the practical ranges, the microlens with the narrowest distance A between lenses, i.e., 0 nm, can be formed at a higher etching rate than that in the prior art. Further, since the distance B between the corners of the lenses can be shortened, the lens area can be enlarged compared with that in the prior art.

As described above, in accordance with the preferred embodiment of the present invention, by controlling the flow rate ratio of a gaseous mixture of a gas containing fluorine atoms but no carbon atoms, e.g., $SF_6$ gas, and a fluorocarbon-based gas having a ratio of carbon atoms to fluorine atoms which is greater than or equal to 0.5, e.g. $C_4F_8$, the etching rate can be increased and also the characteristics of the lens shape can be enhanced compared with those in the prior art.

Accordingly, the productivity of the microlenses can be increased compared with the prior art, and it is possible to form microlenses with an extremely small distance A (e.g., 0 nm) between lenses and larger lens areas than those in the prior art. With such microlenses, since it is possible to ensure high sensitivity due to an increased light collection efficiency, they can be employed to an even more miniaturized solid-state imaging device than conventional ones.

Although there have been described the preferred embodiment of the present invention with reference to the drawings, the present invention is not limited thereto.

While the invention has been shown and described with respect to the preferred embodiments, it will be understood by those skilled in the art that various changes and modifications may be made without departing from the spirit and scope of the invention as defined in the following claims.

What is claimed is:

1. A method for forming microlenses, comprising:
   performing an etching process by using a processing gas on an object to be processed provided with a substrate, a lens material layer formed on the substrate and a mask layer of a lens shape formed on the lens material layer to etch the lens material layer and the mask layer; and
   transcribing the lens shape of the mask layer to the lens material layer,
   wherein the processing gas is a gaseous mixture including a gas containing fluorine atoms but no carbon atoms and a fluorocarbon-based gas having a ratio of the number of carbon atoms to the number of fluorine atoms which is greater than or equal to 0.5, the gaseous mixture including no oxygen gas, and
   wherein the lens material layer is a photo-permeable organic film and the mask layer is a resist film.

2. The method of claim 1, wherein the gas containing fluorine atoms but no carbon atoms is $SF_6$ gas.

3. The method of claim 1, wherein the ratio of the number of carbon atoms to the number of fluorine atoms in the fluorocarbon-based gas is smaller than 0.7.

4. The method of claim 3, wherein the fluorocarbon-based gas contains one or more gases selected from the group consisting of $C_4F_8$, $C_5F_8$ and $C_4F_6$ gas.

5. The method of claim 1, wherein the gaseous mixture further includes one or more gases selected from the group consisting of an additional fluorocarbon-based gas, a hydrofluorocarbon-based gas, CO gas, $CO_2$ gas, $N_2$ gas and an inert gas.

6. The method of claim 1, wherein the gas containing fluorine atoms but no carbon atoms is $NF_3$ gas.

7. A method for forming microlenses, comprising:
   performing an etching process by using a processing gas on an object to be processed provided with a substrate, a lens material layer formed on the substrate and a mask layer of a lens shape formed on the lens material layer to etch the lens material layer and the mask layer; and
   transcribing the lens shape of the mask layer to the lens material layer,
   wherein the processing gas is a gaseous mixture including $SF_6$ gas and one or more fluorocarbon-based gases selected from the group consisting of $C_4F_8$, $C_5F_8$ and $C_4F_6$ gas, and
   wherein the lens material layer is a photo-permeable organic film and the mask layer is a resist film.

8. The method of claim 7, wherein the processing gas contains no oxygen gas.

9. The method of claim 7, wherein the processing gas is a gaseous mixture including $SF_6$ and $C_4F_8$ gas, and a volumetric ratio between the $SF_6$ gas and the $C_4F_8$ gas ($SF_6$ gas:$C_4F_8$ gas) is in the range of 1:1~1:4.

10. The method of claim 7, wherein the processing gas is a gaseous mixture including $SF_6$ and $C_5F_8$ gas, and a volumetric ratio between the $SF_6$ gas and the $C_5F_8$ gas ($SF_6$ gas:$C_5F_8$ gas) is in the range of 1:0.4~1:0.8.

11. The method of claim 7, wherein the processing gas is a gaseous mixture including $SF_6$ and $C_4F_6$ gas, and a volumetric ratio between the $SF_6$ gas and the $C_4F_6$ gas ($SF_6$ gas:$C_4F_6$ gas) is in the range of 1:0.3~1:0.8.

12. The method of claim 7, wherein the gaseous mixture further includes one or more gases selected from the group consisting of an additional fluorocarbon-based gas, a hydrofluorocarbon-based gas, CO gas, $CO_2$ gas, $N_2$ gas and an inert gas.

* * * * *